July 5, 1966 R. W. HATCH, JR 3,259,314
TURBULENCE FLUID LOGIC BINARY COUNTER DEVICE
Filed June 24, 1964 3 Sheets-Sheet 1
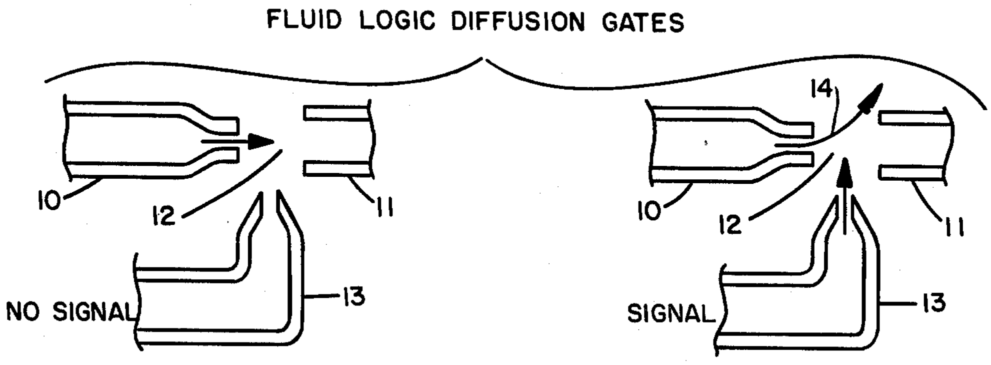
FIG. I FIG. IA
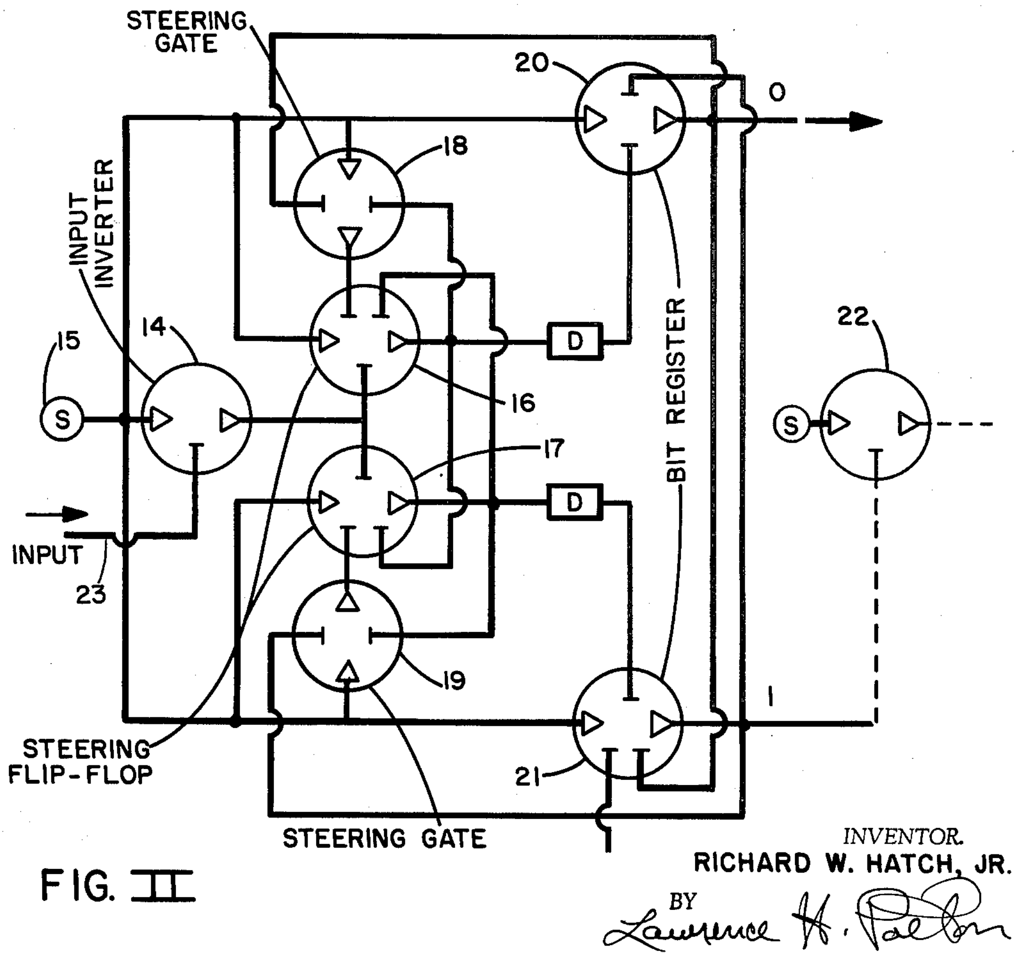
FIG. II
INVENTOR.
RICHARD W. HATCH, JR.
BY Lawrence H. Patton
AGENT TURBULENCE FLUID LOGIC BINARY COUNTER DEVICE
Filed June 24, 1964 3 Sheets-Sheet 2
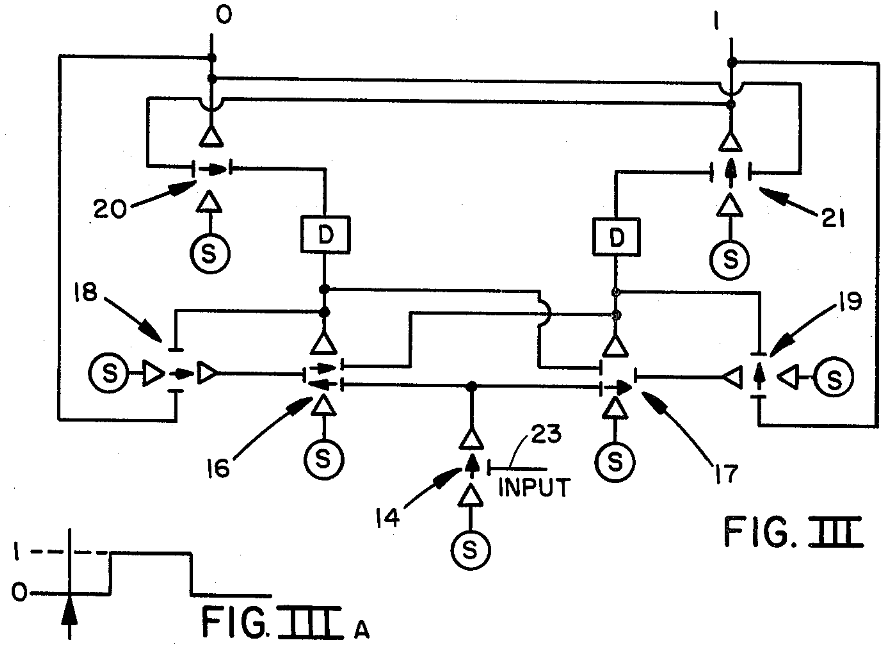
FIG. III, FIG. III A
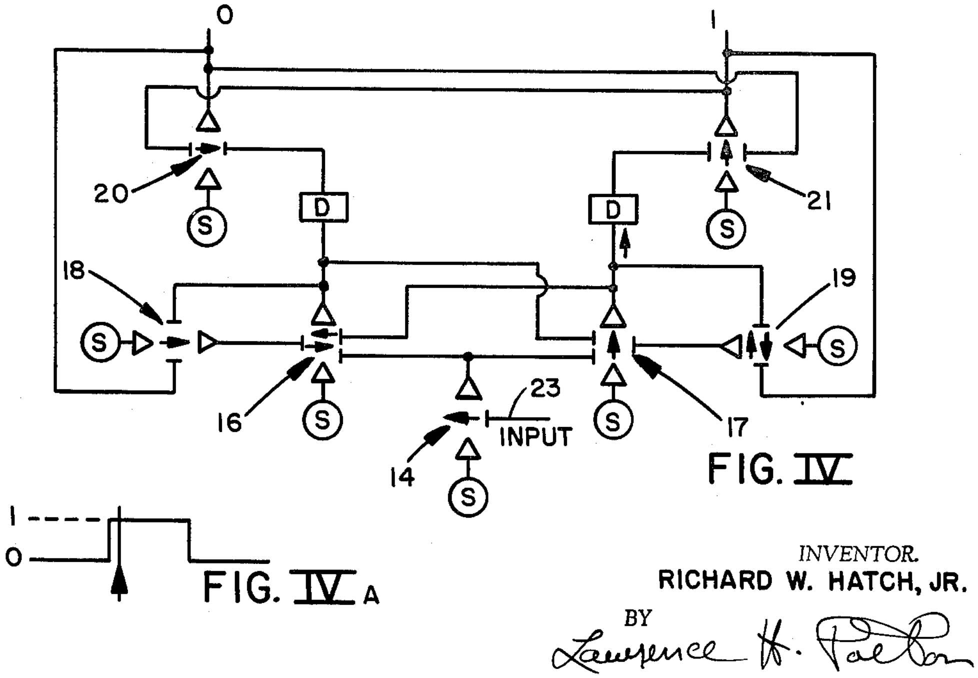
FIG. IV, FIG. IV A
INVENTOR.
RICHARD W. HATCH, JR.
BY
Lawrence H. Patton
AGENT

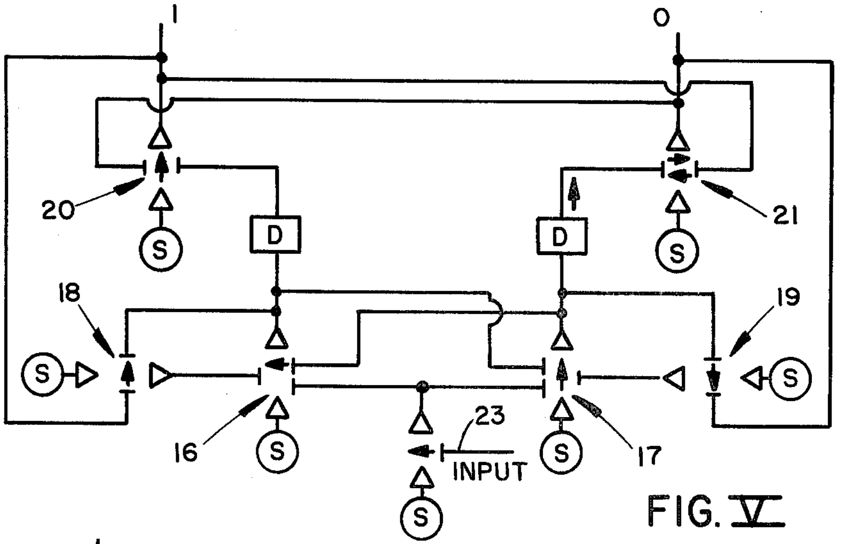
FIG. V
FIG. V A
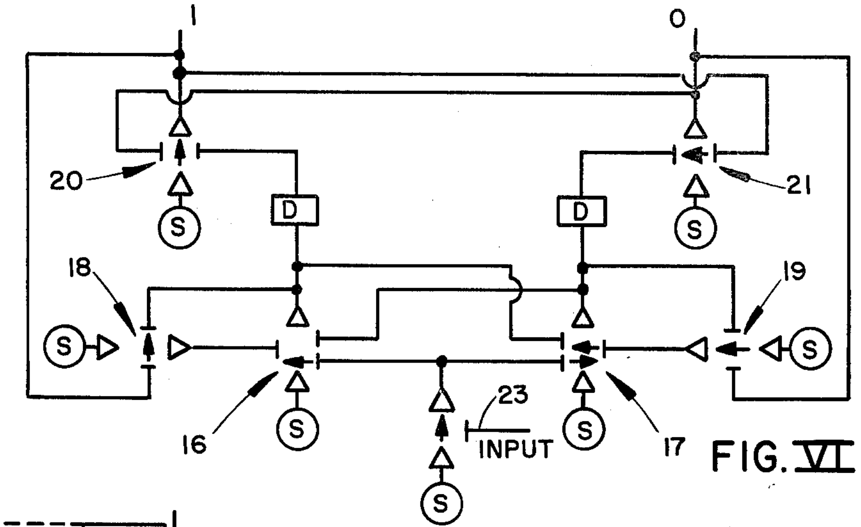
FIG. VI
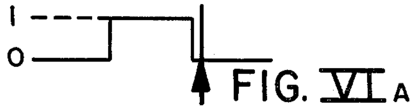
FIG. VI A
INVENTOR.
RICHARD W. HATCH, JR.
BY Lawrence H. Patton
AGENT

United States Patent Office 3,259,314

Patented July 5, 1966

3,259,314

TURBULENCE FLUID LOGIC BINARY COUNTER DEVICE

Richard W. Hatch, Jr., Norwell, Mass., assignor to The Foxboro Company, Foxboro, Mass., a corporation of Massachusetts Filed June 24, 1964, Ser. No. 377,705

1 Claim. (Cl. 235—201)

This invention relates to dynamic continuous flow fluid logic systems and has particular reference to a binary counter device in the form of a single stage by way of illustration.

A particular feature of this invention is the use of fluid logic turbulence or diffusion units throughout the device to provide a uniformity of action on the basis of a continuous flow situation in this dynamic device.

This invention provides a binary counter stage with no moving parts, automatically responsive to a series of input signals to provide binary readouts simultaneously from two outputs as one and zero, which are reversible upon the application of the new pulse to the input of the device.

The device of this invention provides a change, in the fluid logic system on the application of a pulse, achieved by rising signal and followed by an internal preparatory automatic action upon the falling of this same signal in preparation of the next signal.

It is therefore an object of this invention to provide a new and useful binary counter device in the form of a dynamic fluid logic binary device based on fluid logic diffusion units throughout.

Other objects and advantages of this invention will be in part apparent and in part pointed out hereinafter and in the accompanying drawings, wherein:

FIGURE I is an illustration of a diffusion gate which is used in this invention with means for applying a lateral signal but with no signal therein;

FIGURE IA is another illustration of the diffusion unit of FIGURE I, illustrating the situation of a lateral signal being applied thereto and the flow being diffused and cut off from its normal passage;

FIGURE II is a schematic illustration of a fluid logic binary counter stage according to this invention;

FIGURE III is a duplication of the schematic illustration of FIGURE II with indications of a particular initial condition with respect to an incoming pulse as represented in FIGURE IIIA by the vertical line indicating that the initial condition is prior to the application of a pulse to the system;

FIGURE IV illustrates a second state of this system, called the transition state, and is represented in FIGURE IVA as the occurrence of the rising portion of an input pulse;

FIGURE V represents an equilibrium state of this system, as indicated in FIGURE VA, with the vertical line anywhere along the main body of the pulse; and FIGURE VI is a final step of the cycle termed reset situation, as indicated in FIGURE VIA, the position indicated by the vertical line after the pulse, especially after the pulse is dropped from a value to zero. This step of dropping off from a value to zero has an intermediate effect on the system.

In FIGURE I a fluid logic diffusion gate is illustrated with an input passage at 10, and an output passage at 11, separated by a gap as at 12. Ordinarily a fluid flow in the passage 10 will proceed across the gap 12 and out through the passage 11. A control passage 13 is provided to apply a control signal laterally of the passage 12 to diffuse the flow in the gap 12 outwardly as indicated in FIGURE IA by arrow 14. This diffusion or turbulence cuts off any signal which might be going between the input passage 10 and the output passage 11.

In this invention the fluid logic diffusion gates are useful to shut off a signal by applying a lateral control signal thereto, or to allow the main signal to resume simply by removing the lateral control signal.

This is the basis of operation of all the units of this invention and provides a desirable uniformity and simplicity of operation and provides a continuously flowing, dynamic fluid logic system.

The rest of the system of this invention is shown in FIGURE II in one form of symbolism and in FIGURES III, IV, V and VI in another form. The structures are identical and the different symbols are shown merely as a convenience.

In FIGURE II it will be seen that there is an input inverter diffusion unit as at 14. This unit is like that illustrated in FIGURES I and IA as are the other units in this device. There are some differences in that there may be more than one lateral control applied to a diffusion unit, as may be seen in some of the other units of FIGURE II.

Again with reference to FIGURE II, there is a common source of power for all these diffusion units as at 15. This supplies the input inverter 14, a steering flip-flop made up of diffusion units 16 and 17, a pair of steering gates at 18 and 19, and two elements of a bit register as at 20 and 21. In the output of the device there is a "not" element in this same form, as at 22, which may be supplied from the same source if desired although it is shown separately.

In FIGURE II, the bit register binary output is shown as "zero" at bit unit 20, and "one" at bit unit 21. This is one form of "natural" happening due to slight structural differences of the device. If this is so, and the reverse is desired, an adjust signal may be applied to unit 21 through the secondary signal nozzle. If the "natural" output is the reverse, a similar secondary signal nozzle (not shown) could be used in unit 20 to reverse the "natural" situation, if desired.

The input signal is applied through an input passage at 23 at the left of the drawing, and is used as a lateral signal applied to invert inverter 14. The output of the inverter 14 is applied to the flip-flop units 16 and 17 as control therefor.

The outputs of the flip-flop units 16 and 17 are applied to the bit register units 20 and 21. The steering gates 18 and 19 are controlled by a combination of controls from the flip-flop units 16 and 17, and the units 20 and 21 of the bit register as indicated by the connections shown.

With respect to FIGURES III and IIIA, in the initial condition situation, the bit register from the unit 20, is in zero condition and both of the steering flip-flops 16 and 17 are shut off. This is prior to the input of the signal to the input 23 so that the gate 14 is open and there is a signal through it. In the situation shown in FIGURE III the steering gates 18 and 19 are in such condition that only the zero side steering flip-flop 16 will be open when the input shut off occurs by the incurrence of a signal in the input 23. One side of the flip-flop, as at 17, will remain shut off.

In the FIGURE IV transition stage, wherein the input pulse in the input passage 23 has just arrived and on a rising signal basis has reached its upper level, the steering flip-flop units 16 and 17 change from a situation of both being shut off, to a situation where the steering flip-flop 16 remains shut off, and the steering flip-flop 17 is open as indicated in FIGURE IV.

Delays are provided in the outputs of the flip-flop. These delays in the outputs of the steering flip-flop units 16 and 17 prevent the transition of the bit registers 20 and 21 and shut off of the steering gate 18, until alternate shut off of flip-flop 16 from the output of the flip-flop 17, has been established.

Note that at all times the system is in dynamic condition. There is continuous flow in one pattern or another as these changes take place.

In the FIGURE V situation of equilibrium, as indicated in FIGURE VA, the pulse input control is maintained and the situation is at a time indicated by the vertical line in FIGURE VA. The input signal is still on, and therefore the input diffusion unit 14 still full off. Under these conditions the delays in the output of the flip-flops 16 and 17 have been overcome and the bit register flips over so the output of the unit 21 is now zero. The output of the unit 20 is now one, both of the steering gates are now shut off, 18 from the output of the bit register unit 20, 17 from the output of the flip-flop unit 16. Thus this system is now in a stable condition with the steering flip-flops shifted over so the output is now zero and one where it was one and zero.

FIGURE VI is the reset situation. This occurs, as indicated in FIGURE VIA, upon the ending of the input pulse. This action occurs when the pulse goes from its top value down to zero and remains there until another pulse comes along. It is the action of the pulse dropping to zero, that is removing a control, that causes the reset action. Note also in this reset action that the output of the bit register does not change, it remains at the new situation of zero and one. The action that occurs is within the device in a preparatory action in anticipation of the next incoming signal to unit 14.

In this FIGURE VI situation, the return of the input pulse to zero again shuts off both sides of the steering flip-flop. Both units 16 and 17 are cut off when the input signal in the input passage 23 drops to zero. Again one steering gate is open but this time it is gate 19 rather than 18 as previously shown, and gate 18 is shut off. This establishes a new initial condition ready for repetition of the cycle and a consequent return transition of the bit register.

On the input of one signal to the inverter 14, the bit register will reverse its output from zero to one. On the dropping off of that signal to zero, the bit register will remain the same, and the internal devices will be set up for a new change but in an opposite manner to that previously established. When a new second pulse comes in the bit register will be changed back the other way in accordance with the preliminary preparatory change which occurs when the pulse drops as indicated above.

As many stages may be applied to this device as may be desired through suitable coupling means illustrated by the unit 22.

This invention therefore provides a new and useful fluid logic binary counter device based on turbulence units throughout in a dynamic system.

As many embodiments may be made of the above invention, and as changes may be made in the embodiments set forth above without departing from the scope of the invention, it is to be understood that all matter hereinbefore set forth or shown in the accompanying drawings is to be interpreted as illustrative only and not in a limiting sense.

I claim:

A dynamic fluid logic binary counter stage using turbulence gates throughout, said stage comprising, in combination, a diffusion unit input gate, a source of continuous fluid flow to the input of said input gate, and a transverse control pulse signal input to said input gate, whereby the absence of an input signal results in an output from said input gate, and the occurrence of an input signal closes said input gate and results in absence of signal in the output of said input gate, a steering flip-flop comprising a pair of diffusion units, a source of continuous fluid flow to the input of each of said flip-flop units, a transverse control from the output of said input gate to each of said flip-flop units, and cross-over transverse control means from the output of each of said flip-flop units to the other of said flip-flop units, a steering gate system comprising a pair of diffusion units, a source of continuous fluid flow to the input of each of said steering gate units, an output from each of said steering gate units to one of said flip-flop units whereby a transverse control function is directed to each of said flip-flop units through one of said steering gate units, and transverse control means from the output of each one of said flip-flop units to the one of said steering gate units through which control is directed to said one of said flip-flop units, a bit register comprising a pair of diffusion units, a source of continuous fluid flow to the input of each of said bit register units, transverse control means from the output of one of said flip-flop units to one of said bit register units, and from the other of said flip-flop units to the other of said bit register units, and delay means in each of said transverse control means, cross-over transverse control means from the output of each of said bit register units to the other of said bit register units, feedback transverse control means from the output of one of said bit register units to the one of said steering gate units through which control is directed to the one of said flip-flop units from the output of which transverse control means is directed to said one of said bit register units, and from the output of the other of said bit register units to the other of said steering gate units, and, a binary output take-off passage from the output of each of said bit register units.

References Cited by the Examiner

UNITED STATES PATENTS 3,190,554 6/1965 Gehring et al. ------- 235—210

OTHER REFERENCES

Mitchell, "Fluid Binary Counter," IBM Technical Disclosure, volume 6, No. 2, July 1963, page 30.

Grubb, "Fluid Logic Shift Register With Intermediate Stages," IBM Technical Disclosure Bulletin, volume 6, No. 1, June 1963, pages 24–25.

LOUIS J. CAPOZI, *Primary Examiner.*

LEO SMILOW, W. F. BAUER, *Assistant Examiners.*